(12) United States Patent
Steinhagen

(10) Patent No.: US 7,129,766 B2
(45) Date of Patent: Oct. 31, 2006

(54) CMOS ANALOG SWITCH

(75) Inventor: Wolfgang Steinhagen, Mauern (DE)

(73) Assignee: Texas Instruments Incorporated, Dallas, TX (US)

( * ) Notice: Subject to any disclaimer, the term of this patent is extended or adjusted under 35 U.S.C. 154(b) by 177 days.

(21) Appl. No.: 10/901,834

(22) Filed: Jul. 27, 2004

(65) Prior Publication Data

US 2005/0046462 A1    Mar. 3, 2005

(30) Foreign Application Priority Data

Jul. 28, 2003  (DE) ................................ 103 34 334

(51) Int. Cl.
*H03K 17/687*  (2006.01)
(52) U.S. Cl. ........................ 327/427; 327/404; 327/389
(58) Field of Classification Search ................ 327/427, 327/389–390, 404, 434
See application file for complete search history.

(56) References Cited

U.S. PATENT DOCUMENTS 5,475,332 A * 12/1995 Ishimoto ...................... 327/427
5,880,621 A * 3/1999 Ohashi ......................... 327/534
5,994,744 A * 11/1999 Katayama et al. ........... 257/370
6,577,263 B1 * 6/2003 Saito ............................ 341/155
6,828,846 B1 * 12/2004 Tsukazaki et al. ........... 327/404
6,842,063 B1 * 1/2005 Tachibana et al. ........... 327/404

* cited by examiner

*Primary Examiner*—My-Trang Nu Ton
(74) *Attorney, Agent, or Firm*—W. James Brady; Frederick J. Telecky, Jr.

(57)  ABSTRACT

A CMOS analog switch is provided that can handle negative input polarity. The semiconductor substrate wherein the analog switch is formed has a substrate area of n-conductivity type. First and second p-channel transistors are formed in the n-conductivity substrate area and each have a gate, a source connected to the input terminal and a drain connected to the output terminal. The analog switch further has a comparator for comparing a voltage level at the input terminal with ground level, a switch driven by an output of the comparator to selectively connect the n-conductivity area with the signal input terminal for a positive input voltage level or to ground for a negative input voltage level, and control circuitry providing gate control signals for the first and second p-channel transistors. The inherent substrate diodes are effectively kept from becoming conductive.

9 Claims, 2 Drawing Sheets

CMOS ANALOG SWITCH

CROSS REFERENCE TO RELATED APPLICATIONS

This application claims priority under 35 USC § 119 of German Application Serial No. 10334334.2, filed Jul. 28, 2003.

FIELD OF THE INVENTION

The present invention relates to a CMOS analog switch.

BACKGROUND OF THE INVENTION

Conventional analog switches in CMOS technology include n-channel transistors formed in a semiconductor substrate of p-conductivity type. Due to the inherent existence of a diode between the transistor's drain and substrate and another diode between the transistor's source and the substrate (the "substrate diodes"), the analog switch using n-channel transistors cannot handle negative input voltages. With a negative input voltage, the substrate diodes of an n-channel switch become conductive, thereby causing a high input current and/or clamping the input signal.

SUMMARY OF THE INVENTION

The present invention provides a CMOS analog switch that permits negative input voltages.

In accordance with the invention, a CMOS analog switch is provided that is operated with a supply voltage referenced to ground and has a signal input terminal and a signal output terminal. The semiconductor substrate wherein the switch is formed has a substrate area of n-conductivity type. First and second p-channel transistors are formed in the n-conductivity substrate area and each have a gate, a source connected to the input terminal and a drain connected to the output terminal. The analog switch further has a comparator for comparing a voltage level at the input terminal with ground level, a switch driven by an output of the comparator to selectively connect the n-conductivity area with the signal input terminal for a positive input voltage level or to ground for a negative input voltage level, and control circuitry providing gate control signals for the first and second p-channel transistors. Due to the use of two p-channel transistors and to the alternative switching of the n-conductivity substrate area between input level and ground level in response to the polarity of the input signal, an appropriate substrate voltage is ensured over a wide range of input signal levels, and the inherent substrate diodes are effectively kept from becoming conductive.

In the preferred embodiment, the gate control signals are derived from a clock signal, and the control circuitry comprises a pair of AND (or NAND) gates each having a first input connected to a clock signal source and a second input, one of these second inputs being connected directly to the output of the comparator and the other being connected to the output of the comparator through an inverter. Such an embodiment is particularly suited to be used in a switched capacitor circuit and, more particularly, in a sample-and-hold device.

All circuit components are preferably formed in CMOS technology within the same semiconductor substrate. In particular, switching elements are materialized by properly selected and dimensioned CMOS transistors.

Also, in the inactive (OFF) state of the p-channel transistors, the control gates are always biased to the level of the input signal, and the gate control signals (negative pulses) are applied via respective coupling capacitors.

Further features and advantages of the invention will become apparent from the following description of a preferred embodiment with reference to the drawings.

DETAILED DESCRIPTION OF THE DRAWINGS

Figure 1:
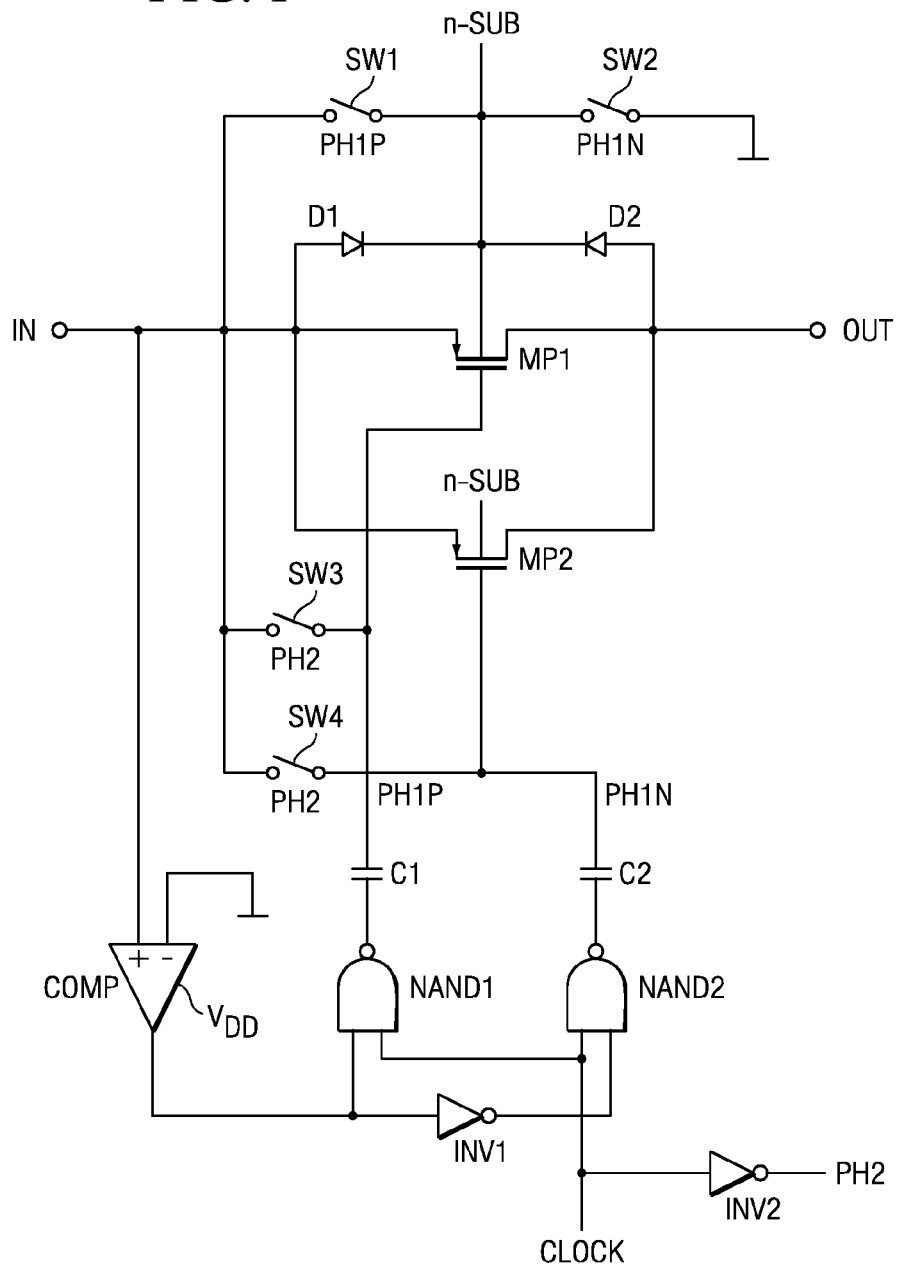
FIG. 1 is a schematic block diagram of the CMOS analog switch.

With reference now to FIG. 1, the CMOS analog switch has an input signal terminal IN and an output signal terminal OUT. A first p-channel transistor MP1 formed in an n-well of a p-substrate has its source connected to the input terminal IN and its drain connected to the output terminal OUT. Likewise, a second p-channel transistor MP2 formed in an (or the same) n-well of the p-substrate has its source connected to the input terminal IN and its drain connected to the output terminal OUT. An inherent substrate diode D1 is seen between the sources of both transistors MP1, MP2 and the n-well, referred to as n-SUB in FIG. 1. Likewise, an inherent substrate diode D2 is seen between the drains of both transistors MP1, MP2 and n-SUB.

A first switch SW1 selectively connects the n-well n-SUB to the input signal terminal IN under control of a signal PH1P.

A second switch SW2 selectively connects the n-well n-SUB to ground under control of a signal PH1N.

A third switch SW3 selectively connects the control gate of transistor MP1 to the input signal terminal IN under control of a signal PH2.

A fourth switch SW4 selectively connects the control gate of transistor MP2 to the input signal terminal IN under control of the signal PH2.

The four switches SW1 to SW4 are each formed by a switching transistor and, preferably, also by a p-channel transistor.

Control signals PH1P, PH1N and PH2 are generated by control circuitry that includes a comparator COMP, a pair of NAND gates NAND1, NAND2 and inverters INV1, INV2. The comparator COMP compares the signal level at input terminal IN with ground. NAND gates NAND1 and NAND2 each have a first input connected to a clock source CLOCK. A second input of NAND gate NAND1 is directly connected to the output of operational amplifier OP. A second input of NAND gate NAND2 is connected to the output of comparator COMP through inverter INV1.

The output of NAND gate NAND1 provides control signal PH1P and is coupled with the control gate of transistor MP1 by a first coupling capacitor C1. The output of NAND gate NAND2 provides control signal PH1N and is coupled with the control gate of transistor MP2 by a second coupling capacitor C2. Control signal PH2 is provided by inverter INV2 the input of which is the clock signal CLOCK.

Figure 2A:
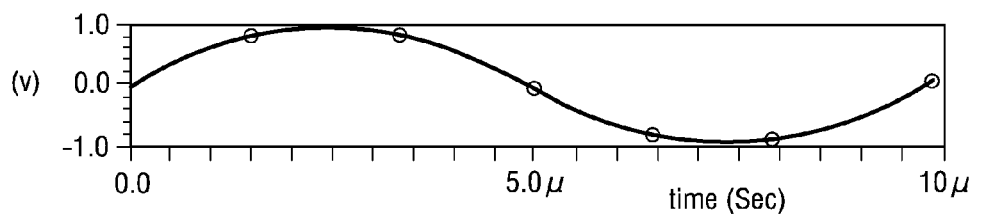
FIGS. 2a to 2e are diagrams of characteristic signals.
Figure 2B:
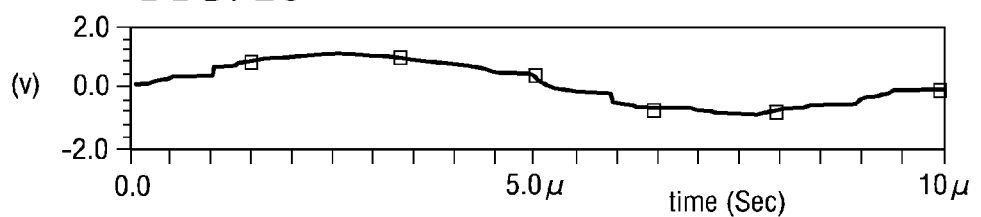
Figure 2C:
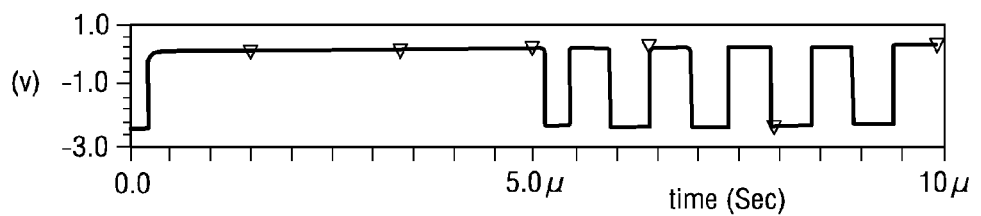
Figure 2D:
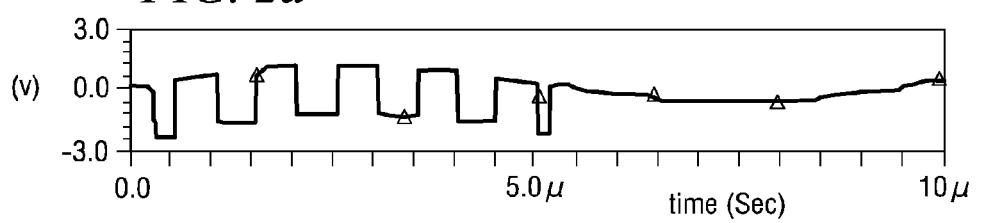
Figure 2E:
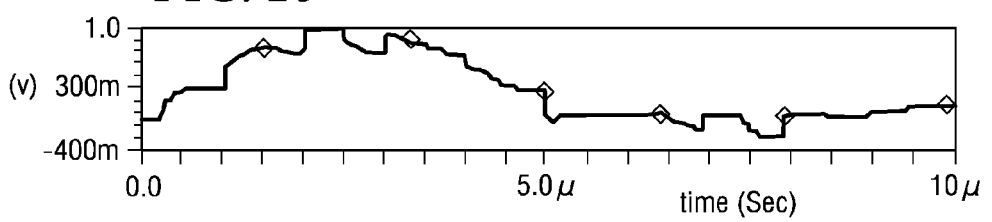

In operation, an input signal such as illustrated in FIG. 2a, i.e. a sine wave signal with an amplitude ranging between +1 Volt and −1 Volt, may be applied to input terminal IN. For the purpose of illustration, a signal frequency of 100 kHz is selected. For the clock signal CLOCK, a period of 1 μs is assumed. The corresponding output signal at terminal OUT is seen in FIG. 2b. As seen in FIGS. 2c and 2d, the control signals PH1N and PH1P reflect the output of comparator COMP, whereas the resulting n-well bias is apparent from FIG. 2e.

In the assumption that the polarity of the input signal is positive, SW1 is closed, SW2 is open and n-SUB is connected to the input terminal IN. The substrate diodes D1 and D2 remain blocked. In the assumption that the polarity of the input signal is negative, SW2 is closed, SW1 is open and n-SUB is connected to ground. Again, the substrate diodes D1 and D2 remain blocked. Independent of the polarity of the input signal, the substrate diodes D1, D2 remain blocked.

It should be clear that all components of the control circuitry and, in particular, the comparator COMP, the NAND gates NAND1, NAND2 and the inverters INV1, INV2 are preferably also materialized in the same semiconductor substrate and in CMOS technology.

The invention claimed is:

1. A MOS circuit for switching an input signal, referenced to a ground, between a signal input terminal and a signal output terminal, comprising:
    first and second p-channel transistors formed in an at least one n-conductivity type substrate area and each having a gate, a source connected to the signal input terminal and a drain connected to the signal output terminal;
    a comparator for comparing a voltage level at the signal input terminal with ground;
    a switch circuit driven by an output of said comparator to selectively connect the at least one n-conductivity type substrate area to the signal input terminal for a positive input voltage level or to the ground for a negative input voltage levels; and
    a control circuitry providing gate control signals for the first and second p-channel transistors.

2. The MOS circuit of claim 1, wherein the gate control signals are derived from a clock signal.

3. The MOS circuit of claim 1, wherein the control circuitry comprises a pair of logic gates, each having a first input connected to a signal source, and each having a second input; one of the second inputs being connected to the output of the comparator and another being connected to the output of the comparator through an inverting element.

4. The MOS circuit of claim 3, wherein the switch circuit comprises a first switching transistor with a source connected to the signal input terminal, a drain connected to the at least one n-conductivity type area and a gate connected to the control circuitry; and a second switching transistor with a drain connected to ground, a source connected to the n-conductivity type area and a gate connected to the control circuitry.

5. The MOS circuit of claim 1, wherein the control circuitry has outputs that are capacitively coupled to the p-channel transistor gates.

6. The MOS circuit of claim 3, wherein the pair of logic gates comprises first and second NAND gates; and further comprising a first capacitor connected to the output of the first NAND gate and also to the gate of the first p-channel transistor; and a second capacitor connected to the output of the second NAND gate and also to the gate of the second p-channel transistor.

7. The MOS circuit of claim 4, wherein the control circuitry comprises a third switching transistor selectively connecting the gate of the first p-channel transistor to the signal input terminal; and a fourth switching transistor selectively connecting the gate of the second p-channel transistor to the signal input terminal; the third and fourth switching transistors being controlled in response to the signal source.

8. The MOS circuit of claim 1, wherein the control circuitry comprises a pair of logic gates, a first of the pair of logic gates having an input connected to the output of the comparator; and a second of the pair of logic gates having an input connected to the output of the comparator through an inverting element.

9. A MOS circuit for switching an input signal, referenced to a ground, between a signal input terminal and a signal output terminal, comprising:
    a first and second p-channel transistors formed in an at least one n-conductivity type substrate area and each having a gate, a source connected to the signal input terminal and a drain connected to the signal output terminals;
    a comparator for comparing a voltage level at the signal input terminal with ground;
    a first switch circuit driven by an output of said comparator to selectively connect the at least one n-conductivity type substrate area to the signal input terminal for a positive input voltage level or to ground for a negative input voltage level;
    a control circuitry providing gate control signals for the first and second p-channel transistors; wherein the control circuitry comprises a pair of logic gates, a first of the pair of logic gates having an input connected to the output of the comparator; and a second of the pair of logic gates having an input connected to the output of the comparator through an inverting element; wherein the pair of logic gates have outputs that are capacitively coupled to the p-channel transistor gates; and
    a second switch circuit driven by a signal source to selectively connect the signal input terminal to each of the gates of the p-channel transistors.

* * * * *